United States Patent
Nölscher

(10) Patent No.: US 7,070,887 B2
(45) Date of Patent: Jul. 4, 2006

(54) PHOTOLITHOGRAPHIC MASK

(75) Inventor: Christoph Nölscher, Nürnberg (DE)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 10/205,552

(22) Filed: Jul. 25, 2002

(65) Prior Publication Data

US 2003/0022074 A1    Jan. 30, 2003

(30) Foreign Application Priority Data

Jul. 25, 2001  (DE) .............................. 101 36 291

(51) Int. Cl.
*G03F 9/00*    (2006.01)
(52) U.S. Cl. ............... 430/5; 378/34; 378/35
(58) Field of Classification Search .......... 430/5; 378/34, 35
See application file for complete search history.

(56) References Cited

U.S. PATENT DOCUMENTS 5,376,483 A * 12/1994 Rolfson ................. 430/5
5,409,789 A   4/1995 Ito
5,591,550 A * 1/1997 Choi et al. ............. 430/5
5,718,829 A * 2/1998 Pierrat ................. 216/12

FOREIGN PATENT DOCUMENTS

JP    2000 305 245 A    11/2000
WO    02/41076 A2       5/2002

* cited by examiner

*Primary Examiner*—Christopher G. Young
(74) *Attorney, Agent, or Firm*—Laurence A. Greenberg; Werner H. Stemer; Ralph E. Locher

(57) ABSTRACT

A photolithographic mask is based on a combination of a half-tone phase mask and an alternating phase mask such that when radiation passes through some of the openings, a phase difference is in each case produced between adjacent openings, and the surroundings of the openings are partly transmissive and shift the phase of the radiation. Consequently, the advantages of alternating phase masks and half-tone phase masks can be realized on one mask and, accordingly, significantly enlarged process windows for the actual lithography process result with the photolithographic mask. In particular, the advantages can be obtained with only one absorber material and the size of non-imaging auxiliary structures is approximately as large as the smallest main structure.

15 Claims, 5 Drawing Sheets

PHOTOLITHOGRAPHIC MASK

BACKGROUND OF THE INVENTION

Field of the Invention

The present invention relates to photolithographic masks. The present invention relates, in particular, to photolithographic masks for the patterning of radiation-sensitive resist layers on semiconductor substrates for the fabrication of large scale integrated semiconductor components.

In the course of the ever decreasing structure dimensions for the production of large scale integrated semiconductor components, a dimensionally accurate photolithographic transfer of mask structures to radiation-sensitive resist layers becomes more and more important. In the meantime, semiconductor components are fabricated with structure line widths of 180 nm or less for commercial use in large volumes, so that the requirements made of the patterning process steps must satisfy very high standards. In this case, the photolithographic transfer of mask structures to radiation-sensitive resist layers is one of the outstanding techniques for patterning layers on semiconductor components.

In this case, the photolithographic transfer of mask structures to a radiation-sensitive resist layer is affected in a plurality of steps. The alignment of the mask above the substrate covered with the radiation-sensitive resist layer is followed by the exposure of the radiation-sensitive resist layer through the mask for marking the resist layer material to be removed (or to be left). In this case, the exposure of the radiation-sensitive resist layer can be affected in the silhouette method, the mask bearing on the resist layer (contact exposure), or being applied closely above the resist layer (proximity exposure). For very high resolution patterning, on the other hand, the exposure is carried out by a so-called projection exposure. In this case, the light that has passed through the mask is focused in a projection objective onto the resist layer, the projection objective imaging the maximum possible number of higher orders of diffraction produced by the mask structure. This imaging method makes it possible to image a minimum transferable structure line width R of $$R = k\lambda/NA \quad (1)$$

from the mask onto the resist layer. In this case, $\lambda$ is the wavelength with which irradiation or exposure is effected, NA is the numerical aperture and k is an empirical constant whose value today is about 0.4.

If the radiation-sensitive resist layer is a positive resist layer, then the exposure brings about at the exposed locations a chemical alteration of the resist layer material, which can be flushed out from the resist layer during development. In contrast, if the radiation-sensitive resist layer is a negative resist layer, then the non-exposed material is flushed out during development. In order to obtain the same structure as in the case of the positive resist, the mask must be patterned essentially complementarily with respect to the mask for the positive resist.

The exposure is followed by the development of the resist layer by spraying or dripping on developer liquid that selectively strips away (or selectively leaves hard) the marked resist layer material. After the drying of the substrate, the patterned resist is finally obtained, which, in conclusion, is generally subjected to a thermal step for curing.

At the end, the minimum structure line width on the mask which is actually produced after the production of the resist structure is greater than that calculated from (1), for a number of reasons. First, the resist layer has a finite thickness, so that the imaging blurs slightly; furthermore, the developer acts isotropically, so that the resist is also removed in the lateral direction during the development of the resist layer. The minimum structure line width on the mask that is required for the production of a resist layer structure on a semiconductor substrate therefore depends on many parameters and is determined individually for each patterning process.

The mask contains e.g. an unpatterned quartz glass substrate that is light-transmissive even in the UV region and on which a thin opaque layer, usually made of black chromium, is applied. The black chromium layer produces, together with the transmissive regions, the mask structure that is imaged onto the resist layer. In this case, the black chromium layer produces the darkened regions on the resist layer, while the light-transmissive region produces the exposed regions on the resist. If the resist is positive, then the resist becomes soft in the exposed regions and is removed by the development step. If the resist is negative, then the resist remains hard in the exposed regions, so that the non-exposed regions are removed during development. For a dimensionally accurate structure transfer, it is furthermore important to ensure a homogeneous exposure dose over the region to be exposed.

Various effects can contribute to impairing the dimensional fidelity. First, the finite resist contrast $\gamma$, which is a measure of the resist removal gradient, causes rounding of originally cornered mask structures. Furthermore, interference effects, diffraction effects and scattered light which arise at structure elements of the mask, the resist layer and/or the prepatterned substrate surface can result in the effective exposure dose not being homogeneous in the resist layer regions.

SUMMARY OF THE INVENTION

It is accordingly an object of the invention to provide a photolithographic mask which overcomes the above-mentioned disadvantages of the prior art devices of this general type, which reduces or completely avoids the problems described and which is able, in particular, to transfer both densely packed structures and isolated structures into the photoresist layer with a high resolution and high process window.

With the foregoing and other objects in view there is provided, in accordance with the invention, a photolithographic mask. The mask contains at least one radiation-transmissive substrate, and at least one layer for shifting a phase of radiation. The layer is disposed on the radiation-transmissive substrate and has openings formed therein for shifting the phase of the radiation. The openings are formed such that a phase difference is in each case produced upon the radiation passing through adjacent ones of the openings.

The photolithographic mask according to the invention is based on a combination of a half-tone phase mask and an alternating phase mask such that when the radiation passes through some of the openings, a phase difference is in each case produced between adjacent openings, and the surroundings of the openings are partly transmissive and shift the phase of the radiation. In the context of the present application, two openings are designated as adjacent if substantial interference effects occur in the case of the radiation that passes through the two openings. These are similar to those of a conventional alternating phase shift mask (PSM), so that the resolution is doubled compared with a chrome-on-glass (COG) mask. Moreover, with the same mask, it is possible to image isolated or half-isolated mask gaps with the half-tone absorber; small phase assist structures are not necessary. Consequently, the advantages of alternating phase masks and half-tone phase masks can be realized on one mask and, accordingly, significantly enlarged process windows for the actual lithography process result with the photolithographic mask according to the invention. In particular, these advantages can be obtained with only one absorber material.

In accordance with one preferred embodiment of the photolithographic mask according to the invention, the size of the openings is matched to the phase of the radiation passing through the openings.

In accordance with a further preferred embodiment of the photolithographic mask according to the invention, in the layer which shifts the phase of the radiation, provision is made of main openings, which are formed such that the pattern formed by the main openings is transferred to the resist layer in the event of irradiation, and auxiliary openings, which are formed such that the pattern formed by the auxiliary openings is not transferred to the resist layer in the event of irradiation. A phase difference is produced when the radiation passes through an auxiliary opening and its adjacent main openings.

This preferred embodiment of the photolithographic mask according to the invention provides the use of auxiliary openings in addition to the actual main openings that determine the structure. In this case, the auxiliary openings have a phase deviation matched to the adjacent openings. In a preferred embodiment, the auxiliary openings have a phase deviation of 0°. In order still to transfer enough light through these auxiliary openings, the latter must be fabricated relatively wide in relation to the main structure.

This crucially reduces the requirement made of the mask technique. The auxiliary openings make it possible to obtain a significant improvement in the aerial image contrast primarily outside the image plane and thus to ensure a significantly increased depth of focus.

The use of the auxiliary openings again leads to a significant enlargement of the process window in particular in the case of isolated or half-isolated structures and also a reduction of the difference in the line widths with respect to densely packed structures. The main openings often have a rectangular form, the main openings generally being significantly longer than wide. In this case, the auxiliary openings are preferably formed parallel to the actual main openings.

Furthermore, it has been shown that, in the case of the photolithographic mask according to the invention, the auxiliary openings can be made significantly larger than in the prior art, in particular than in the case of half-tone dark field masks, without the auxiliary openings being transferred into the resist layer. In this case, the mask is realized in particular in such a way that the main structures are assigned the phase 180°, the auxiliary structures are assigned the phase 0° and the light which radiates through the absorber is assigned the phase 180°. On account of the significantly increased size of the auxiliary openings, the mask according to the invention can also be monitored and inspected significantly more easily, this being something that often led to problems in the case of conventional masks. In particular, in the case of the photolithographic mask according to the invention, the auxiliary openings can be made just as large as the main openings. In this case, it is particularly preferred if no phase difference is produced when the radiation passes through a main opening and when the radiation passes through the layer that shifts the phase of the radiation.

Furthermore, it is preferred if at least one auxiliary opening is provided for a half-isolated main opening. In the context of the present application, a main opening is designated as half-isolated if it has an adjacent main opening only in one direction. In the case of a half-isolated main opening, therefore, at least one auxiliary opening is provided which replaces the "missing" adjacent main opening in the opposite direction.

Furthermore, it is preferred if at least two auxiliary openings are provided for an isolated main opening. In the context of the present application, a main opening is designated as isolated if it has no adjacent main opening. In the case of an isolated main opening, therefore, at least two auxiliary openings are provided which replace the "missing" adjacent main openings.

In accordance with one preferred embodiment, a phase difference of 180° is in each case produced when the radiation passes through adjacent openings. Consequently, it is particularly preferred if a phase difference of 180° is produced when the radiation passes through an auxiliary opening and its adjacent main opening or its adjacent auxiliary opening.

Furthermore, it is preferred if the openings (main openings and/or auxiliary openings) form a grating-shaped pattern. In this case, it is preferred if the auxiliary openings are disposed at a distance from the adjacent main opening which amounts to approximately the period of the grating.

In accordance with an added feature of the invention, the auxiliary openings or the main openings are disposed at a distance, which amounts to approximately a period of a grating, from an adjacent one of the auxiliary openings or the main openings.

In accordance with a further feature of the invention, the layer for shifting the phase of the radiation has a radiation transmission of 3% to 10%.

Other features which are considered as characteristic for the invention are set forth in the appended claims.

Although the invention is illustrated and described herein as embodied in a photolithographic mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
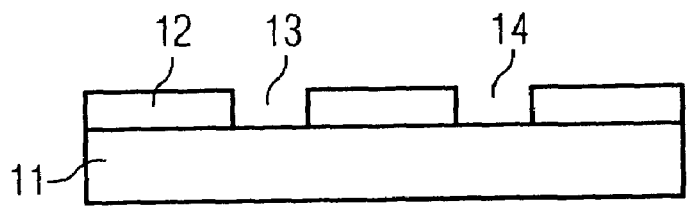
FIG. 1A is a diagrammatic sectional view of a photolithographic mask according to the prior art.
Figure 1B:
FIG. 1B is a graph showing a field strength distribution in regards to FIG. 1A.

Referring now to the figures of the drawing in detail and first, particularly, to FIG. 1A thereof, there is shown a conventional lithographic mask which has a radiation-transmissive substrate 11 made of glass, for example, and a radiation-opaque layer 12 made of chromium, for example. In this case, openings 13, 14 in the radiation-opaque layer 12 correspond to the structure that is intended to be transferred to the photoresist layer on the wafer in the corresponding masking step. During an exposure, radiation, for example ultraviolet light, passes through the openings 13, 14 in the radiation-opaque layer 12 and, on account of interference effects, results in the illustrated distribution of the electric field E in the photoresist layer on the wafer (FIG. 1B).

Figure 1C:
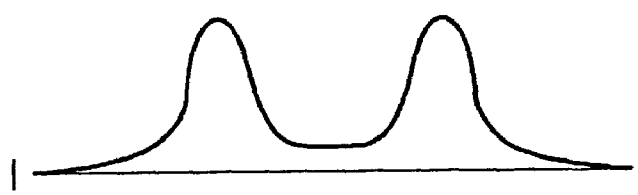
FIG. 1C is a graph showing a corresponding intensity distribution in regards to FIG. 1A.

On account of interference effects, an undesirable exposure occurs in the photoresist layer between the openings 13 and 14, an actually dark region on the mask. Since the exposure intensity is proportional to the square of the field strength, the field strength distribution shown in FIG. 1B results in a corresponding intensity distribution I in the photoresist layer (FIG. 1C).

In order to avoid these difficulties and in order to improve the structure resolution, so-called "alternating phase masks" are also increasingly being used, therefore, instead of the previously described so-called "dark field masks". In this case, a phase deviation is applied to every second opening 13 in the radiation-opaque layer 12, for example by etching the glass substrate 11, in such a way that a phase difference is obtained between adjacent openings 13, 14. In this case, 180° is generally set as the phase difference. By using this technique it is possible, in the case of highly periodic, grating-like structures, to obtain an increase in the structure resolution by up to a factor of 2 compared with the conventional technique.

Figure 2A:
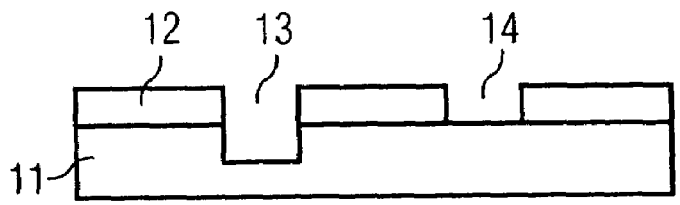
FIG. 2A is a sectional view of a second photolithographic mask according to the prior art.
Figure 2B:
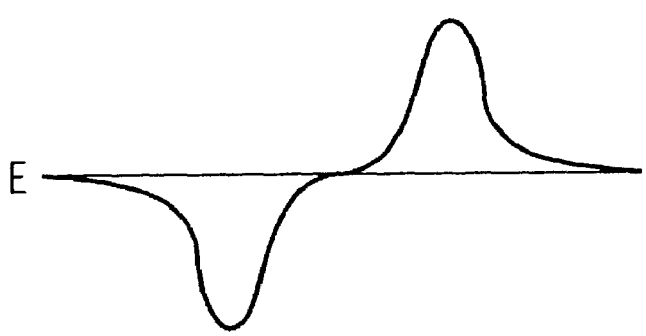
FIG. 2B is a graph showing a field strength distribution in regards to FIG. 2A.
Figure 2C:
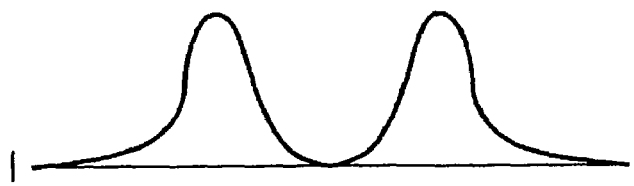
FIG. 2C is a graph showing a corresponding intensity distribution in regards to FIG. 2A.

FIG. 2A illustrates the resulting situation. On account of the 180° phase difference between the adjacent openings 13, 14, destructive interference now occurs between the radiation that passes through the left-hand opening 13 and the radiation that passes through the right-hand opening 14. Therefore, the field distribution E in the photoresist layer now has a zero between the two openings 13, 14, which accordingly also results in a significantly lower intensity I between the two openings 13, 14 (see FIGS. 2B, 2C). The exposure contrast is significantly improved in this way.

Unfortunately, however, the positive effect occurs only for radiation-opaque structures that have an opening with a phase difference on both sides. Since the patterns formed by the openings correspond to the structures that are intended to be imaged or transferred into the photoresist layer, situations can arise, however, in which openings with only one adjacent opening or fully isolated openings occur. In this case, it can happen that such a half-isolated or fully isolated opening is not imaged completely into the resist layer. Attempts have been made hitherto to ensure a transfer into the photoresist layer by widening the corresponding openings at least under optimum lithographic conditions (optimum focus, nominal exposure). However, the lithographic process window is then so small that the corresponding structures, in the production process, often lead to a failure of the component.

Accordingly, this technique is used only in rare cases in practice, which has the consequence that critical structures in the layout must be prohibited, which results, however, in a drastic limitation in the application of alternating phase masks.

A further possibility for increasing the structure resolution compared with conventional dark field masks consists in the use of so-called "half-tone phase masks" ("half-tone phase shift mask" (HTPSM)). To that end, instead of a radiation-opaque layer, a layer which is radiation-transmissive to a certain percentage (e.g. 3% to 10% radiation transmission) is used, which shifts the phase of the radiation passing through it by a predetermined magnitude, and is applied to the glass substrate. Afterward, the so-called "half-tone layer" is correspondingly patterned to produce openings in the layer that are matched to the pattern to be transferred. If the mask is then irradiated, a phase jump (generally 180°) occurs at the edges of the openings, as a result of which the attainable resolution can be increased.

Figure 3A:
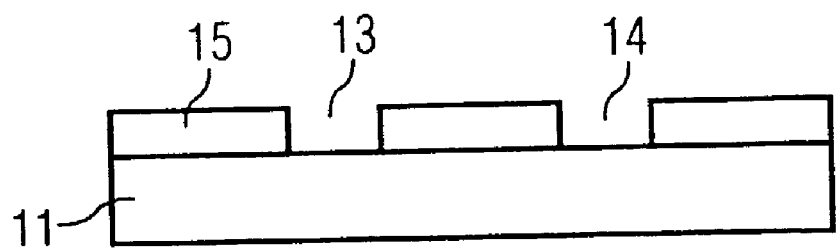
FIG. 3A is a sectional view of a third photolithographic mask according to the prior art.
Figure 3B:
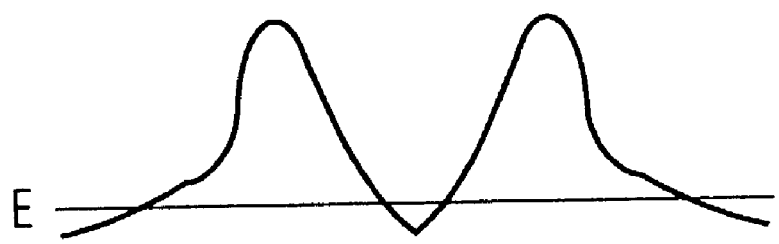
FIG. 3B is a graph showing a field strength distribution in regards to FIG. 3A.
Figure 3C:
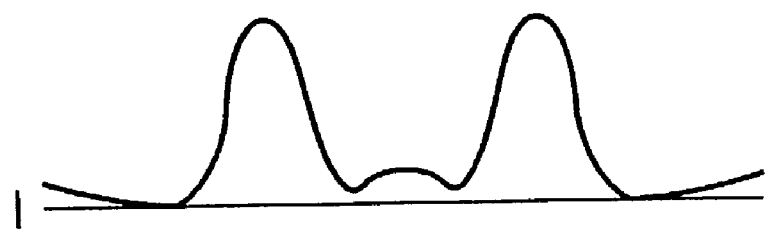
FIG. 3C is a graph showing a corresponding intensity distribution in regards to FIG. 3A.

FIGS. 3A–3C illustrate the resulting situation. The radiation that passes through the openings 13 is not shifted in its phase and has a relatively high intensity. The radiation that passes through the half-tone layer 15 is shifted by 180° in its phase and simultaneously reduced in its intensity. On account of the 180° phase difference between the openings 13 and regions of the half-tone layer 15, a destructive interference occurs at the edge of the openings 13, as a result of which the electric field has a zero and the irradiation contrast is significantly improved.

Unfortunately, however, in the case of half-tone phase masks, the resolution and the process window are relatively small in the case of very densely packed structures with circular illumination. The imaging of these structures can be improved by inclined illumination, although auxiliary structures are required for the simultaneous imaging of isolated structures, which auxiliary structures require a high outlay in the drawing, fabrication and inspection of the masks.

Figure 4:
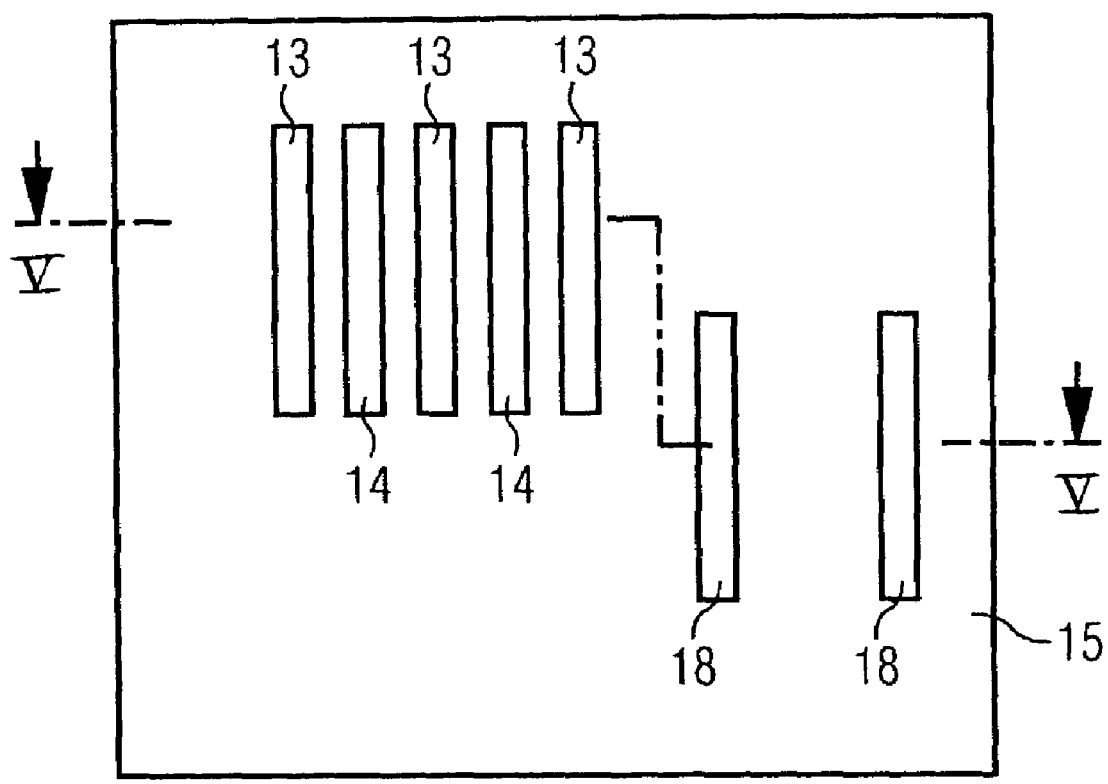
FIG. 4 is a plan view of a photolithographic mask of a first embodiment according to the invention.

FIG. 4 diagrammatically shows a photolithographic mask in accordance with a first embodiment of the invention. The embodiment shown in FIG. 4 has the radiation-transmissive substrate 11, for example made of glass, and the layer 15 that is radiation-transmissive to a certain percentage and is applied to the substrate 11 and shifts the phase of the radiation that passes through it by a predetermined magnitude. $MoSi_2O_xN_y$, for example, can be used as a material for the half-tone layer 15.

Figure 5:
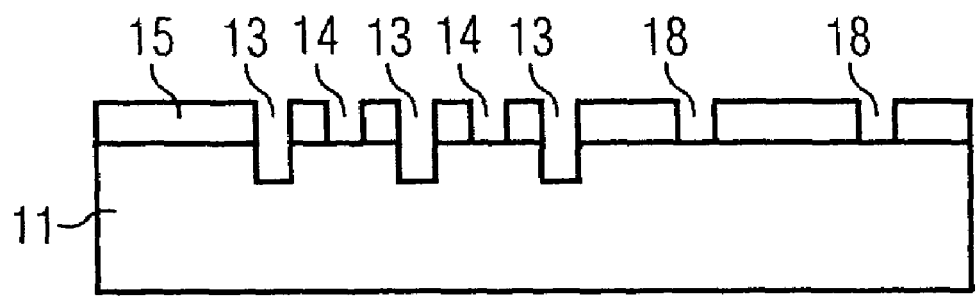
FIG. 5 is a diagrammatic, sectional view taken along the line V—V shown in FIG. 4.

The mask has a group of five main openings 13 and 14, which are disposed regularly and relatively close together, and largely isolated main openings 18. In this case, the main openings are each provided as openings in the half-tone layer 15. Furthermore, the main openings 13 and 14 are formed such that a phase difference is in each case produced when the radiation passes through adjacent main openings 13, 14. In the present embodiment, the phase difference, preferably 180°, is produced by a corresponding depression of the substrate 11 in the region of the openings 13 (see FIG. 5).

The mask according to the invention thus has the advantages of a half-tone phase mask for the isolated and the not particularly densely packed main openings 18 and the advantages of an alternating phase mask for the densely packed main openings 13, 14. In this case, the mask according to the invention is formed such that there is no chromium present in the imaging region, i.e. all the absorbing regions of the mask contain half-tone material, as a result of which the mask fabrication and inspection is simplified to a significant extent. That does not rule out the case where Cr is still present in some regions of the mask, e.g. in the scribe line or at the outer edge thereof.

Figure 6:
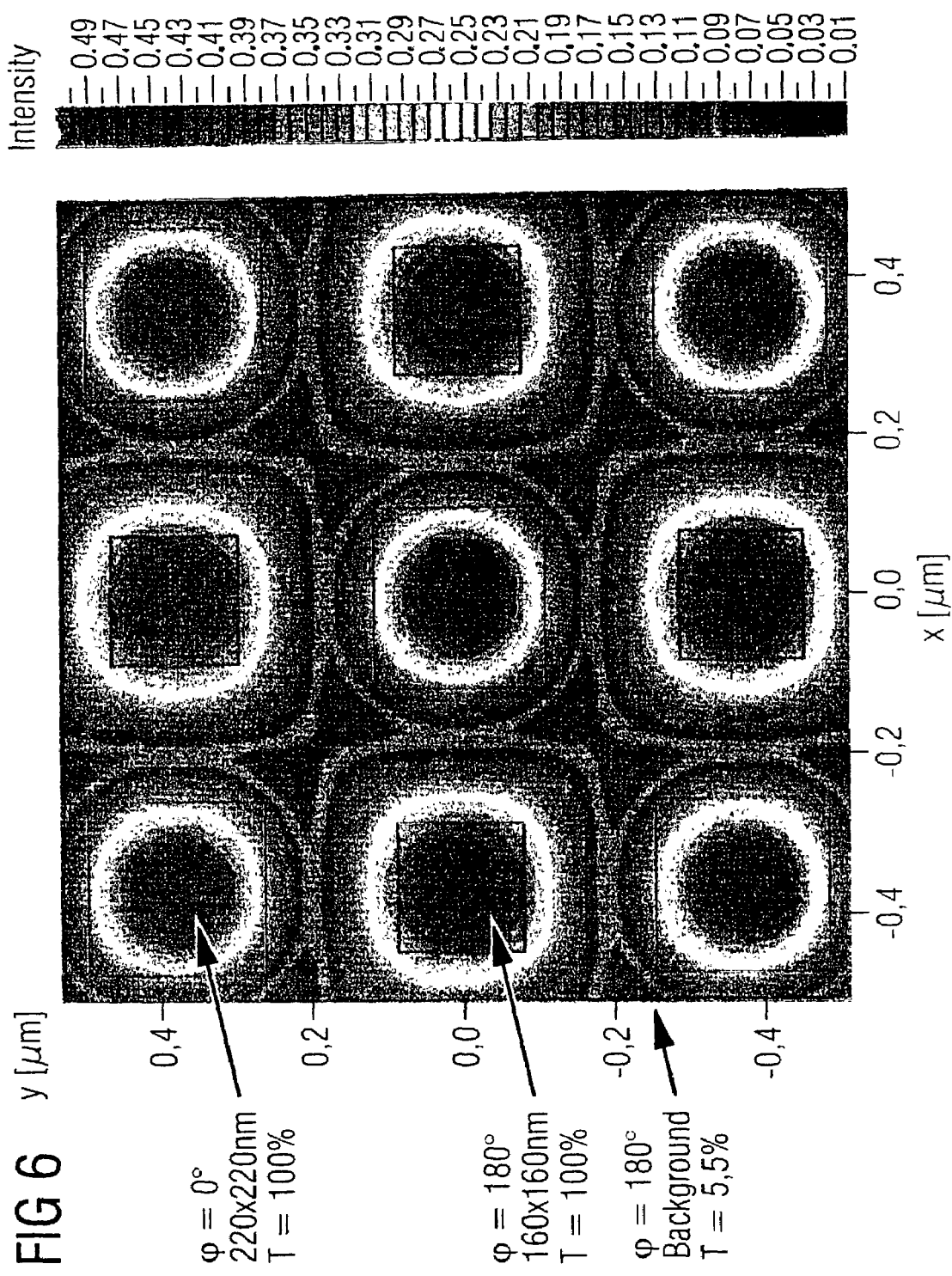
FIG. 6 is a photograph of the photolithographic mask in accordance with a second embodiment according to the invention.

FIG. 6 shows a detail from a photolithographic mask in accordance with a second embodiment of the invention. The mask serves for producing contact holes having a diameter of 180 nm and a center-to-center distance ("pitch") of 360 nm (in each case relative to the wafer). At the same time, FIG. 6 shows a corresponding intensity distribution for an exposure with $\lambda=248$ nm, NA=0.68 and $\sigma=0.5$ ($\sigma$ is a measure of incoherence of the exposure). In this case, the main openings 14 have a size of 220×220 nm, a phase of 0° and a transmission of 100%. The main openings 13 have a size of 160×160 nm, a phase of 180° and a transmission of 100%. The remaining regions (half-tone material 15) have a phase of 180° and a transmission of 5.5%.

During the exposure, there results for the main opening 13 a dose leeway of about 10% in conjunction with a focus leeway of about 0.5 µm. A dose leeway of about 23% results for the main opening 13. Compared with a pure half-tone phase mask, the mask according to the invention results in more than a doubling of the process window for the actual lithography process.

Figure 7:
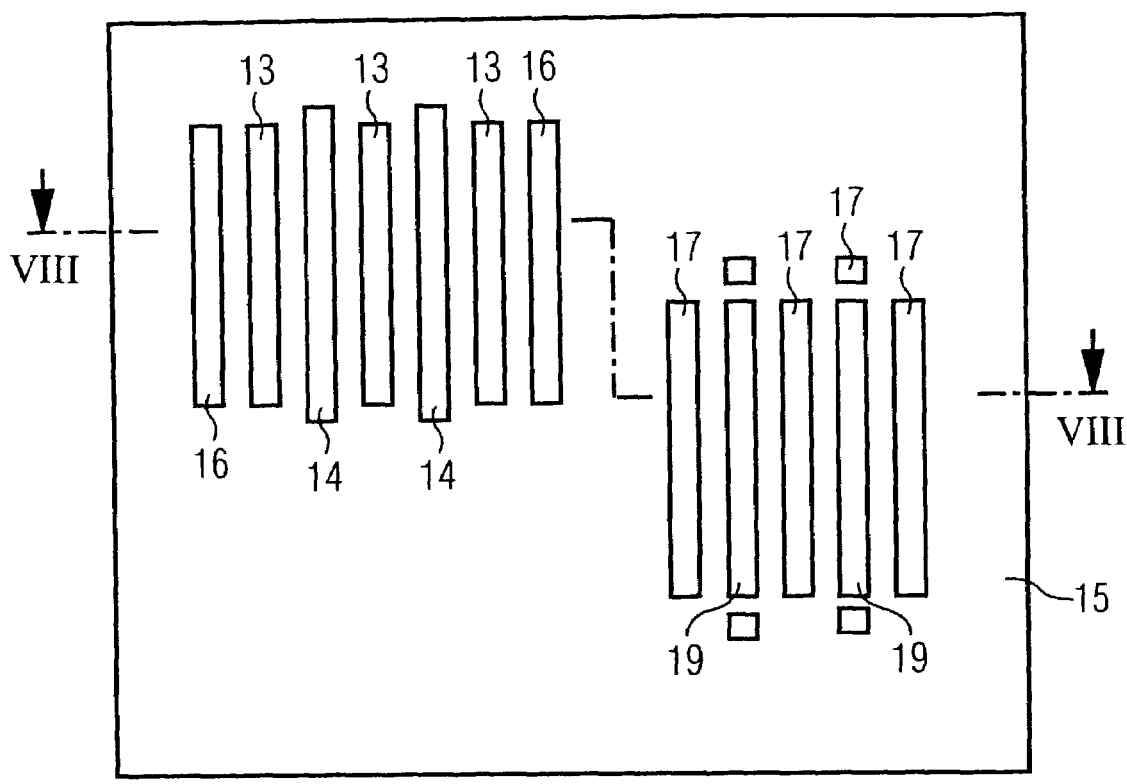
FIG. 7 is a plan view of a third embodiment of the photolithographic mask according to the invention.

FIG. 7 shows a photolithographic mask in accordance with a third embodiment of the invention. The embodiment shown in FIG. 7 again has the radiation-transmissive substrate 11, for example made of glass, and the layer 15 that is radiation-transmissive to a certain percentage and is applied to the substrate 11 and shifts the phase of the radiation that passes through it by 180°. The mask again has a group of five main openings 13 and 14, which are disposed regularly and relatively close together, and largely isolated main openings 19. Furthermore, the main openings 13 and 14 are formed such that a phase difference of 180° is in each case produced when the radiation passes through adjacent main openings 13, 14.

An auxiliary opening 16 is in each case disposed parallel to the outer main openings 13, the phase deviation differing from the adjacent main openings by 180°. The auxiliary openings 16 have the effect that the half-isolated outer main openings 14 are imaged with a significantly higher aerial image contrast and the exposure method has a significantly improved lithographic process window. Despite the fact that the auxiliary openings 16 are the same size as the main openings 13, 14, the auxiliary openings 16 are not transferred into the resist layer.

Figure 8:
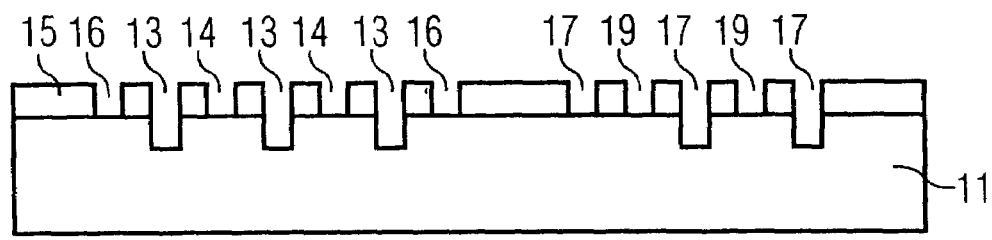
FIG. 8 is a diagrammatic, sectional view of the third embodiment taken along the line VIII—VIII shown in FIG. 7.

In contrast, the isolated main openings 19 are assisted by auxiliary openings 17 on all sides. The auxiliary openings 17, oriented parallel to the main openings 19, are likewise the same size as the main openings 19. Despite their size, however, they are not transferred into the resist layer. In this case, the phase relationships in the surroundings of the isolated main openings 19 are chosen such that no phase difference is produced when the radiation passes through a main opening 19 and when the radiation passes through the half-tone layer 15. In contrast, a phase difference of 180° occurs when the radiation passes through a main opening 19 and when the radiation passes through the corresponding auxiliary openings 17. This is achieved, for example, once again by corresponding depressions in the glass substrate in the region of the auxiliary openings 17 (see FIG. 8).

The use of the auxiliary openings again leads to a significant enlargement of the process window in particular in the case of isolated or half-isolated structures and also a reduction of the difference in the line widths with respect to densely packed structures. Furthermore, by virtue of the auxiliary openings, the main openings can be imaged with good quality over a significantly larger region of defocusing. This is important in particular when a completely planar surface is not present on the substrate and, consequently, it is not possible to focus simultaneously onto all the regions of the surface. On account of the significantly increased size of the auxiliary openings, the mask according to the invention can also be monitored and inspected significantly more easily, this being something that often led to problems in the case of conventional masks. In particular, the auxiliary openings can be made just as large as the main openings in the case of the photolithographic mask according to the invention.

I claim:

1. A photolithographic mask, comprising:
   at least one radiation-transmissive substrate; and
   at least one phase shifting layer for shifting a phase of radiation, said phase shifting layer disposed on said radiation-transmissive substrate and having openings, said openings formed such that a phase difference is in each case produced upon the radiation passing through adjacent ones of said openings.

2. The photolithographic mask according to claim 1, wherein said openings have a size matched to the phase of the radiation passing through said openings.

3. The photolithographic mask according to claim 1, wherein said openings in said layer includes main openings formed such that a pattern formed by said main openings is transferred to a resist layer in an event of irradiation, and auxiliary openings formed such that a further pattern formed by said auxiliary openings is not transferred to the resist layer in the event of irradiation, a phase difference being produced upon the radiation passing through one of said auxiliary openings and an adjacent one of said main openings.

4. The photolithographic mask according to claim 3, wherein no phase difference is produced when the radiation passes through a respective one of said main opening and when the radiation passes through said phase shifting layer for shifting the phase of the radiation.

5. The photolithographic mask according to claim 3, wherein a phase deviation of 0° is produced when the radiation passes through one of said auxiliary openings.

6. The photolithographic mask according to claim 3, wherein at least one of said auxiliary openings is provided for a half-isolated main opening.

7. The photolithographic mask according to claim 3, wherein at least two of said auxiliary openings are provided for an isolated main opening.

8. The photolithographic mask according to claim 3, wherein a phase difference of 180° is in each case produced when the radiation passes through adjacent ones of said openings.

9. The photolithographic mask according to claim 3, wherein some of said main openings form a grating-shaped pattern.

10. The photolithographic mask according to claim 3, wherein some of said auxiliary openings form a grating-shaped pattern.

11. The photolithographic mask according to claim 3, wherein some of said main openings and some of said auxiliary openings form a grating-shaped pattern.

12. The photolithographic mask according to claim 11, wherein said auxiliary openings are disposed at a distance, which amounts to approximately a period of a grating, from an adjacent one of said main openings.

13. The photolithographic mask according to claim 11, wherein said auxiliary openings are disposed at a distance, which amounts to approximately a period of a grating, from an adjacent one of said auxiliary openings.

14. The photolithographic mask according to claim 1, wherein said phase shifting layer for shifting the phase of the radiation has a radiation transmission of 3% to 10%.

15. A photolithographic mask for irradiation of radiation-sensitive resist layers on semiconductor substrates, the photolithographic mask comprising:

at least one radiation-transmissive substrate; and at least one phase shifting layer for shifting a phase of radiation, said phase shifting layer disposed on said radiation-transmissive substrate and having openings, said openings formed such that a phase difference is in each case produced upon the radiation passing through adjacent ones of said openings.

* * * * *